(12) United States Patent
Chen

(10) Patent No.: US 6,803,800 B2
(45) Date of Patent: Oct. 12, 2004

(54) NEGATIVE VOLTAGE SWITCH AND RELATED FLASH MEMORY FOR TRANSFERRING NEGATIVE VOLTAGE WITH TRIPLE-WELL TRANSISTORS

(75) Inventor: Yin-Chang Chen, Hsinchu Hsien (TW)

(73) Assignee: AMIC Technology Corporation, Hsin-Chu (TW)

( * ) Notice: Subject to any disclaimer, the term of this patent is extended or adjusted under 35 U.S.C. 154(b) by 0 days.

(21) Appl. No.: 10/249,152

(22) Filed: Mar. 19, 2003

(65) Prior Publication Data

US 2004/0080355 A1 Apr. 29, 2004

(30) Foreign Application Priority Data

Oct. 24, 2002 (TW) ..................................... 091124834 A

(51) Int. Cl.[7] ................................................ H03L 5/06
(52) U.S. Cl. .......................... 327/333; 327/55; 327/57; 327/65
(58) Field of Search .................... 327/52–57, 63–67, 327/333; 326/68, 81

(56) References Cited

U.S. PATENT DOCUMENTS 5,872,476 A * 2/1999 Mihara et al. ............... 327/333
6,240,027 B1 * 5/2001 Lee et al. ............... 365/189.11
6,359,473 B1 * 3/2002 You et al. ..................... 327/52

* cited by examiner

Primary Examiner—Kenneth B. Wells
(74) Attorney, Agent, or Firm—Winston Hsu

(57) ABSTRACT

A negative voltage switch for use in flash memory. The switch has a control end and two voltage output ends, and includes two inverting units for transferring a positive voltage, two driving units for transferring a negative voltage, and two negative voltage pass-gate transistors for respectively transferring the negative voltage to the voltage outputs. Each inverting unit connects to a driving unit at a corresponding node, and each negative voltage pass-gate transistor connects to one of the nodes. According to a voltage at the control end, the switch turns on one inverting unit to transfer the positive voltage at the corresponding node, and the driving unit connected to the other node turns on to transfer the negative voltage to the corresponding negative voltage pass-gate transistor such that the negative voltage pass-gate transistor stops outputting the negative voltage at the other voltage output.

21 Claims, 6 Drawing Sheets

NEGATIVE VOLTAGE SWITCH AND RELATED FLASH MEMORY FOR TRANSFERRING NEGATIVE VOLTAGE WITH TRIPLE-WELL TRANSISTORS

BACKGROUND OF INVENTION

1. Field of the Invention

The present invention relates to a switch for switching an output voltage, more specifically, a switch, for use in a flash memory, using a triple-well MOS transistor for switching a negative output voltage.

2. Description of the Prior Art

Various microprocessor systems that are able to handle data and arrange information have become an important foundation of information development in the highly developed modern information society. A memory used to store digital data and to provide stored data for microprocessor systems is one of the most important structures in each kind of microprocessor system. A flash memory or an EEPROM (electrically erasable programmable read only memory), due to electron operation, is able to store data in a non-volatile way and to read the stored data quickly and efficiently, unlike optical or magnetic storage media (such as a disc or an optical disc) cooperating with machines so as to access data. Therefore, the flash memory with light volume and convenient and efficient operation has been utilized widely in various microprocessor systems, such as application chip systems, mobile phones, personal digital assistants, personal computers, digital cameras, etc.

A flash memory consists of MOS transistors with a floating gate, each serving as a memory cell for recording a bit data. Please refer to FIG. 1, which shows a schematic diagram of a typical memory transistor Tm. The memory transistor Tm, in addition to a body B, a drain D, a source Sc, and a control gate G as well as a typical MOS transistor, has a floating gate FG. The floating gate FG is located in an oxide layer, insulating from the body B, the drain D, the source Sc, and the control gate G. While storing data, the gate G, the source Sc, the drain D, and the body B are required to be applied proper bias voltages so that the electrons can pass through the oxide layer and thus flow into the floating gate FG. A different amount of charge injected into the floating gate FG of the transistor Tm corresponds to different data. For instance, if more charge is injected into the floating gate FG, the transistor Tm stores a bit data "1"; on the contrary, if less charge is injected into the floating gate FG, the transistor Tm stores a bit data "0". The amount of the charge injected into the floating gate will influence the threshold voltage of the transistor Tm. The more negative charge injected into the floating gate of the transistor Tm is, the smaller absolute value of the threshold voltage of the transistor Tm is. Under the circumstance of keeping the control voltage applied on the control gate G, the more negative charge within the floating gate FG is, the higher the conduct performance associated with the transistor Tm is, so that the current between the source and drain of the transistor Tm is greater. In other words, under the circumstance of keeping the control voltage applied on the control gate G, the bit data stored in the transistor Tm depends on the amount of conduct current in the transistor Tm between its source and drain. While overwriting or erasing the original data stored in the memory transistor Tm, the control gate G, the body B, the drain D, and the source Sc are still required to have proper bias voltages applied, causing the electrons within the floating gate FG to pass through the oxide layer and flow into other electrodes of the transistor Tm.

From the previous description, causing charge to pass through the oxide layer (i.e. tunnel effect) is an indispensable step during the operation of the flash memory. However, only very high or very low voltages applied onto the control gate G would induce tunnel-effect. While reading data or other operations, the bias voltage applied onto the control gate G has to be switched to normal voltage. For example, within a flash memory biased with DC 3V, the control gate G probably requires a bias voltage of 9V (in conjunction with 8V applied at the body B) so that the charge passes through the oxide layer for data-erasing. While reading or other operations, the bias of the control gate G has to switch to 0V. Under this circumstance, a special switch is necessary for providing different bias voltages corresponding to different operations, and for meeting special bias requirements with respect to the memory transistor. For instance, the switch is in need of providing 0V or 9V to the control gate of the transistor. Each circuit is usually biased between a positive voltage and ground voltage, i.e. 0V. However, a negative voltage lower than 0V is generated by a specific charge pump, and a specific circuit design is required for switching and transferring the negative voltage to each memory transistor.

SUMMARY OF INVENTION

It is therefore a primary objective of the claimed invention to provide a switch for switching various voltages and related application. More specifically, a switch capable of providing 0V ground voltage and negative voltage so as to meet various required voltages under various operations.

In the preferred embodiment of claimed invention, a switch is formed within a chip biased between a positive voltage and ground voltage with 0V, and for use in switching an output voltage with 0V or a lower-than-0V negative voltage according to an inputted voltage at a control end. The switch consists of two p-type MOS transistors for transferring positive voltages, and four triple-well MOS transistors for transferring negative voltages, forming a level-offset circuit for offsetting the input voltage in the range of a positive voltage and 0V into that of a positive voltage and a negative voltage. In this way, other four triple-well n-type MOS transistors that are respectively used to transfer ground voltage and negative voltage can correctly be turned on or turned off by the offset voltage which is in the range of a positive voltage and a negative voltage, and can selectively output a ground voltage and a negative voltage at the two output ends.

These and other objectives of the claimed invention will no doubt become obvious to those of ordinary skill in the art after reading the following detailed description of the invention, which is illustrated in the various figures and drawings.

DETAILED DESCRIPTION

Figure 1:
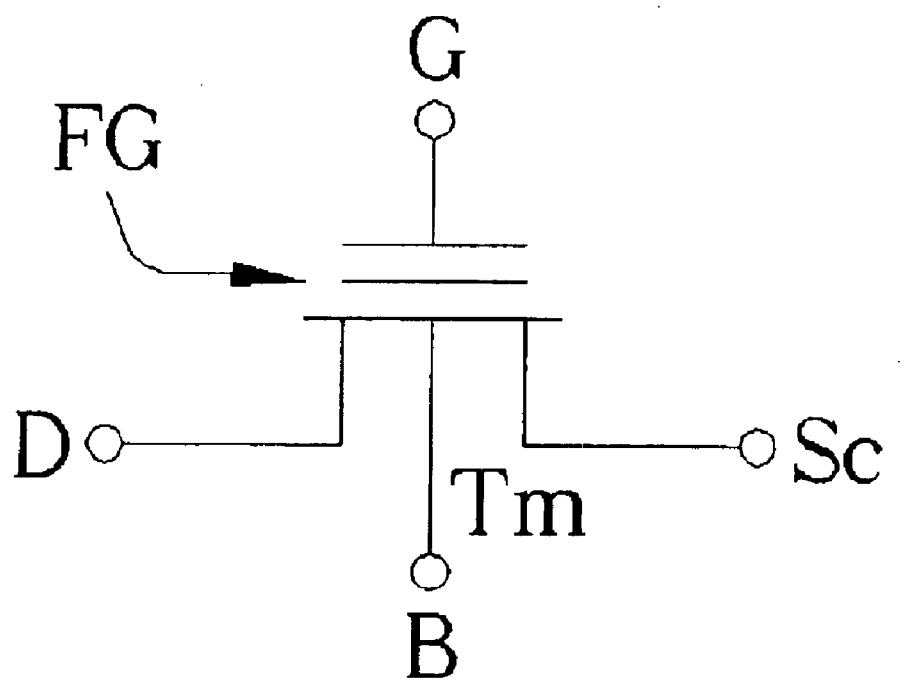
FIG. 1 is a schematic diagram of a typical memory transistor.
Figure 2:
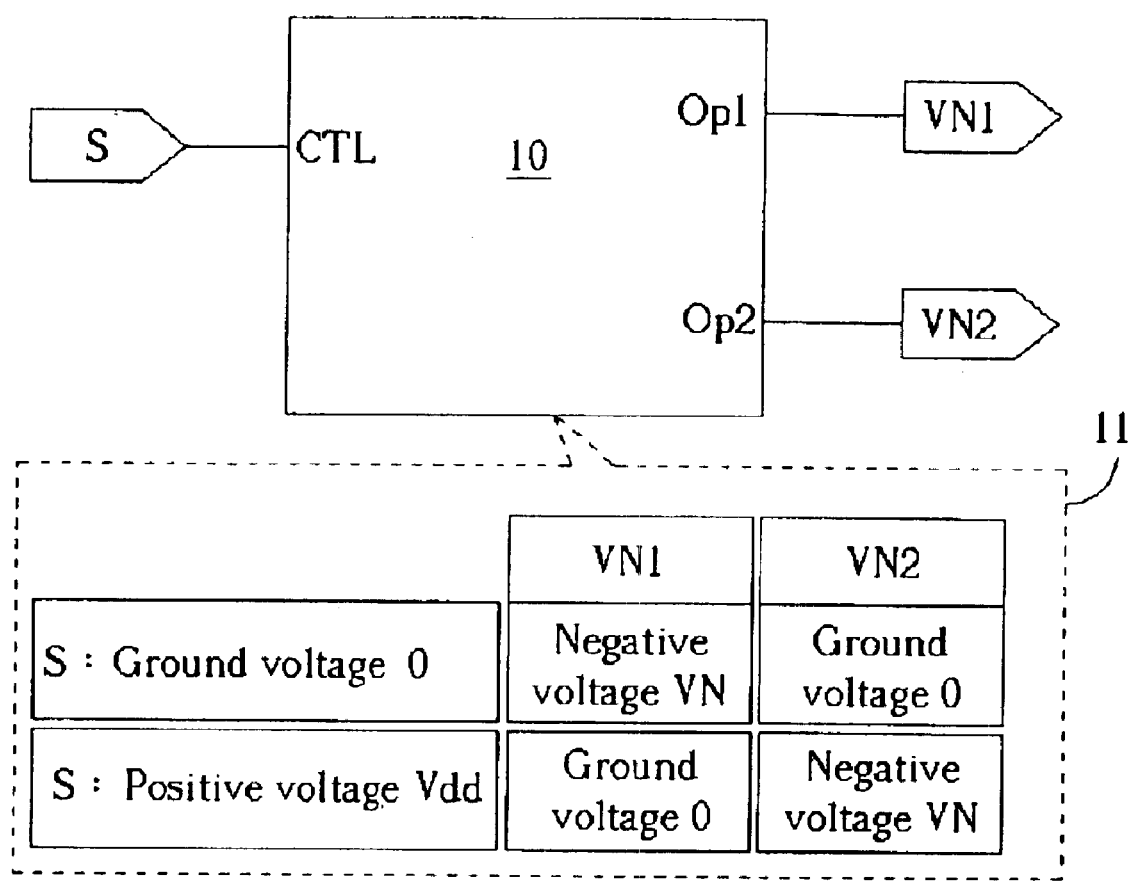
FIG. 2 is a block diagram of a switch according to the present invention.

Please refer to FIG. 2, which shows a block diagram of a switch 10 according to the present invention. A switch 10 is capable of being configured with a flash memory on a chip biased between a positive voltage Vdd and ground with 0V. The switch 10 includes a control end CTL for receiving a voltage S, and two output ends Op1, Op2 respectively for outputting voltages VN1, VN2. The switch 10 can switch voltages VN1, VN2 based on the voltage S. A table 11 shown in FIG. 2 lists a result with respect to the switch 10. While the voltage S is ground voltage with 0V, voltages VN1, VN2 are respectively switched to a negative voltage VN and ground voltage with 0V. While the voltage S is a positive voltage Vdd, voltages VN1, VN2 are respectively switched to ground voltage with 0V and a negative voltage VN. In the preferred embodiment, the positive voltage Vdd can be 3V, and the negative voltage VN can be 9V.

Figure 3:
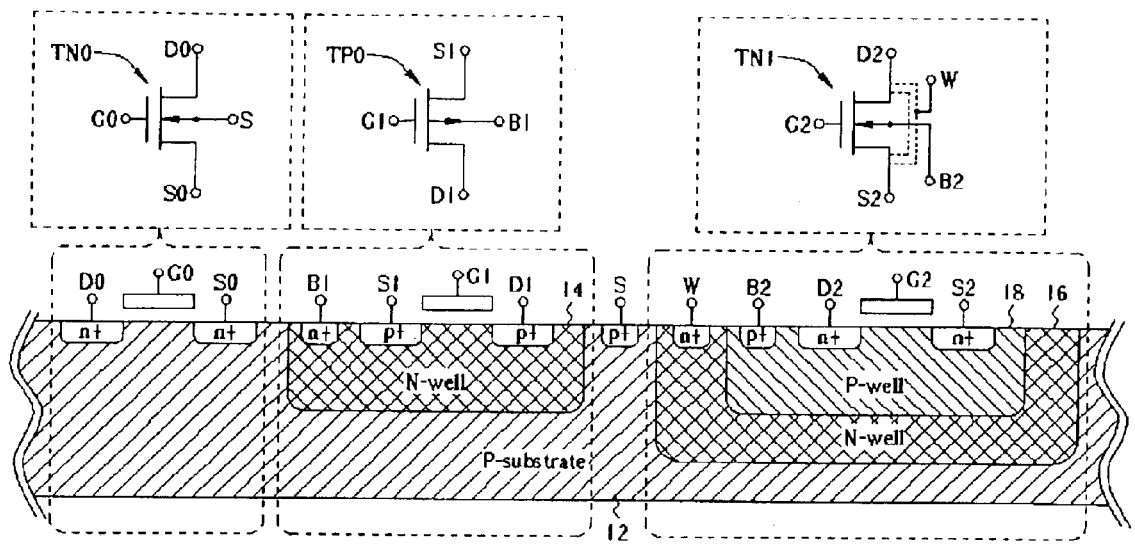
FIG. 3 is a schematic diagram of various structures associated with various transistors.

Within the chip that is biased with the positive voltage Vdd and ground voltage, if intending to transfer the negative voltage VN, a specific charge pump is needed to generate the negative voltage lower than ground voltage, and a triple-well n-type MOS transistor is also required to transfer the negative voltage. Please refer to FIG. 3 showing a schematic diagram of various structures associated with various transistors. In general, with reference to FIG. 3, all the transistors are formed on a p-type substrate 12 biased with ground voltage with 0V at a node S by way of a $p^+$ doped region. An n-type MOS transistor TN0 and a p-type MOS transistor TP0 are classic transistors widely used in circuit design. The transistor TN0 has two $n^+$ doped regions respectively acting as the drain at the node D0 and as the source at the node S0, and a conduction layer isolating an oxide layer as the gate at the node G0. Since the transistor TN0 is configured on the p-type substrate 12, the whole p-type substrate 12 acts as the body of the transistor TN0. In other words, the voltage applied on the p-type substrate 12 is the bias voltage of the body of the transistor TN0. As shown in FIG. 3, the body bias of the transistor TN0 equals to the bias voltage applied at the node S. On the other hand, the typical p-type transistor TP0 is formed on an n-well 14 acting as the body of the transistor TP0 by way of an $n^+$ doped region at node B1. The two $p^+$ doped regions on the n-well 14 respectively are acting as the drain of the transistor TP0 at the node D1 and the source of the transistor TP0 at the node S1, and a conduction layer isolating an oxide layer is acting as the gate of the transistor TP0 at the node G1.

If a typical transistor TN0 is used to transfer the negative voltage VN lower than 0V, either the source (the node S0) or the drain (the node D0) has to be applied with the negative voltage VN. Since the p-substrate 12 itself is biased with zero voltage which is higher than the negative voltage, the negative voltage applied on the source or the drain will lead to a forward bias between the $n^+$ doped region and p-type substrate 12, resulting in incorrect operation of the transistor TN0. Accordingly, the purpose of the triple-well n-type MOS transistor is for isolating the p-type substrate 12 while transferring the negative voltage VN. The transistor TN1 shown in FIG. 3, a triple-well n-type MOS transistor, isolates the p-type substrate 12 with a deep n-well 16, and is biased at the node W through an $n^+$ doped region. The p-type well 18 forming on the n-type well 16 acts as the body of the transistor TN1, and is biased at the node B2 through a $p^+$ doped region. The two $n^+$ doped regions forming on the p-type substrate 18 respectively act as the drain (the node D2) and the source (the node S2) of the transistor TN1. While desiring to transfer a negative voltage, the node W of the n-type well 16 is capable of being biased with a positive voltage Vdd. On account of the isolation of the n-well 16, the body of the transistor TN1, formed in the p-well 18, can be biased with a negative voltage VN by way of the node B2, leading to a conduction between the drain and the source, for transferring the negative voltage VN.

Figure 4:
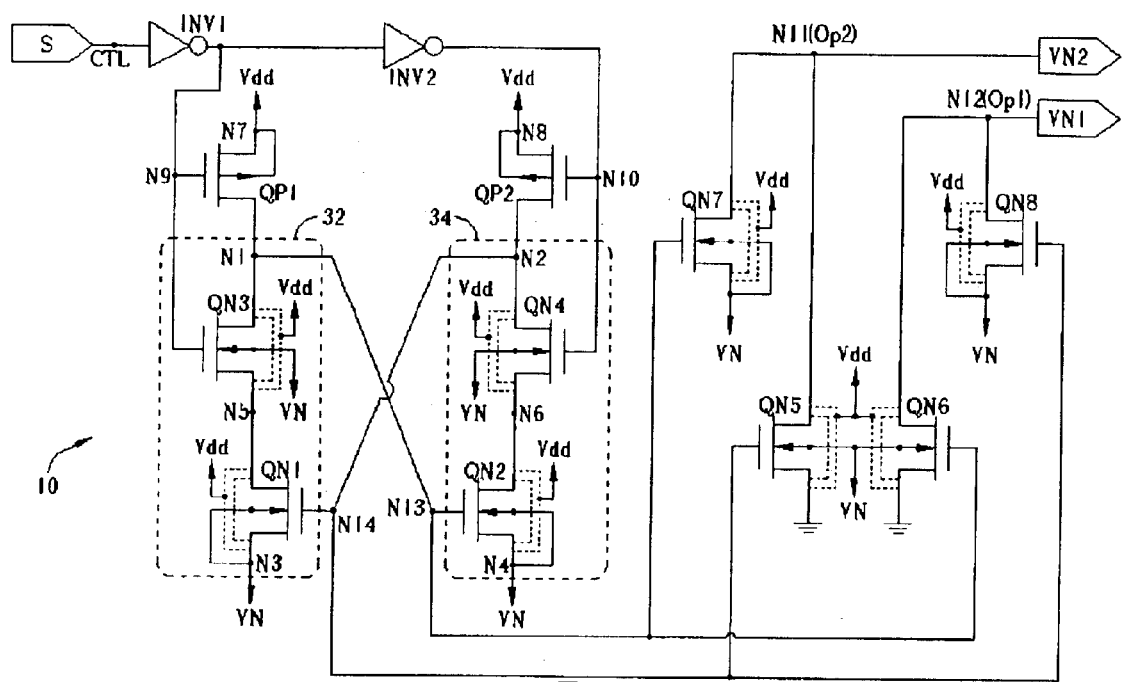
FIG. 4 is a circuit diagram of the switch illustrated in FIG. 2.

Please refer to FIG. 4 in conjunction with FIG. 2. FIG. 4 is a circuit diagram of the switch 10 according to the present invention. The switch 10 has two inverters INV1, INV2, two p-type MOS transistors QP1, QP2 acting as inverting units, two driving units 32, 34, two triple-well n-type transistors QN5, QN6 for transferring ground voltage, and two triple-well n-type transistors QN7, QN8 for transferring negative voltages. The gates of the transistors QP1, QP2 each acting as an inverting unit electrically connected to the nodes N9, N10 act as input ends, the drains of the transistors QP1, QP2 electrically connected to the nodes N1, N2 act as output ends, and the bodies and the sources of the transistors QP1, QP2 are biased with a positive voltage Vdd at the nodes N7, N8. After applied at the control end CTL, the voltage S will be inverted by the two inverters INV1, INV2 and then be inputted into the transistors QP1, QP2 at the node N9, N10. The p-type MOS transistors QP1, QP2 can be realized with the transistor TP0 illustrated in FIG. 3.

Moreover, the four triple-well n-type MOS transistors QN1–QN4 form two driving units 32, 34. Within the driving unit 32, the gate of the transistor QN1, the node N14, acts as an input end, and the drain of the transistor QN3, the node N1, acts as an output end. The transistor QN1 for transferring a negative voltage VN, whose source, the node N3, is biased with the negative VN, and whose drain, the node N5, is electrically connected to the source of the transistor QN3. The gate of the transistor QN3, the node N9, is used to receive the output voltage from the inverter INV1. Similarly, within the driving unit 34, the gate of the transistor QN2, the node N13, acts as an input end, the drain of the transistor QN4, the node N2, acts as an output end. The transistor QN2 for transferring a negative voltage VN, whose drain, the node N6, is electrically connected to the source of the transistor QN4. The gate of the transistor QN4, the node N10, is used to receive the output voltage from the inverter INV2. To sum up, the transistor QP1 as an inverting unit accepts the output voltage of the inverter INV1 at the node N9 for an input voltage, and the driving unit 32 accepts the input voltage from the node N2 at the node N14. Both the output ends of the transistor QP1 and the driving unit 32 are electrically connected to the node N1, for controlling the voltage at the node N1. On the other hand, the transistor QP2 as an inverting unit accepts the output voltage of the inverter INV2 at the node N10 for an input voltage, and the driving unit 34 accepts the input voltage from the node N1 at the node N13. Both the output ends of the transistor QP2 and the driving unit 34 are electrically connected to the node N2 for controlling the voltage at the node N2.

The transistors QN5, QN6, function as ground-voltage transferring units, of which both the sources are biased by ground voltage with 0 Volt, the gates at the nodes N14, N13 are for respectively receiving the voltage from the nodes N2, N1, and the drains at the nodes N11, N12 are for outputting the voltage VN2, VN1. Hence, the nodes N11, N12 are served as the two output ends Op2, OP1 of the switch 10. Similarly, The transistors QN7, QN8, function as negative-voltage transferring units, of which both the sources are biased by negative voltage VN, the gates at the nodes N13, N14 are for respectively receiving the voltage from the nodes N1, N2, and the drains at the nodes N11, N12 are for transferring the negative voltage to the two output ends Op2, OP1 of the switch 10. Eight triple-well n-type MOS transistors QN1–QN8 shown in FIG. 8 can be realized with the transistor TN1 illustrated in FIG. 3. Each body of the transistors QN1–QN8, located in the p-well, is biased by the negative voltage VN, and the n-well for isolating the substrate is biased by the positive voltage Vdd.

Relative to each triple MOS transistor for transferring negative voltage, the inverters INV1, INV2 of the switch 10 are capable of being formed by normal CMOS (like the transistors TN0, TP0 shown in FIG. 3). In other words, for the inverters INV1, INV2, if the input voltage is in the range between the standard positive voltage Vdd and ground voltage, the output voltage is also in the range between the positive voltage Vdd and ground voltage. The operation principle of the switch 10 is described as follows. When the voltage S is ground voltage representing digital "0", the inverter INV1 would output an inverting output with the positive voltage Vdd at the node N9, and then the inverter INV2 outputs ground voltage with 0V at the node N10. The positive voltage Vdd at the node N9 makes the transistor QP1 turn off, and the ground voltage at the node N10 makes the transistor QP2 turn on. The turn-on transistor QP2 will transfer the positive voltage Vdd to the node N2, meaning that the voltage at the node N2 is the positive voltage Vdd. The transistors QN3, QN1 within the driving unit 32 are turned on, due to the positive voltage Vdd at the nodes N9, N2, involving that the negative voltage VN is transferred to the node N1. Within the driving unit 34, ground voltage and the negative voltage VN at the node N10, N1 respectively result in the transistor QN4, QN2 turning off. The negative voltage VN at the node N1 result in the transistor QN7, QN6 turning off, and the positive voltage Vdd at the node N2 result in the transistor QN5, QN8 turning on, so that ground voltage and the negative voltage VN are transferred to the nodes N11, N12, and thus voltage VN2, VN1 are ground voltage and the negative voltage VN, respectively as with the table 11 shown in FIG. 2.

Similarly, when the voltage S is positive voltage Vdd representing digital "1", the inverter INV1 would output an inverting output with ground voltage at the node N9, and then the inverter INV2 outputs the positive voltage Vdd at the node N10. The ground voltage at the node N9 makes the transistor QP1 turn on, and the positive voltage Vdd at the node N10 makes the transistor QP2 turn off. The transistors QN3, QN1 within the driving unit 32 are turned off, due to the ground voltage at the node N9, and the negative voltage at the node N2. The negative voltage VN at the node N2 makes the transistors QN5, QN8 turn off, and the positive voltage Vdd at the node N1 makes the transistor QN7, QN6 turn on, so that the negative voltage VN and the ground voltage are transferred to the nodes N11, N12, and thus voltage VN2, VN1 are switched into the negative voltage VN and ground voltage, respectively, as with the table 11 shown in FIG. 2.

Figure 5:
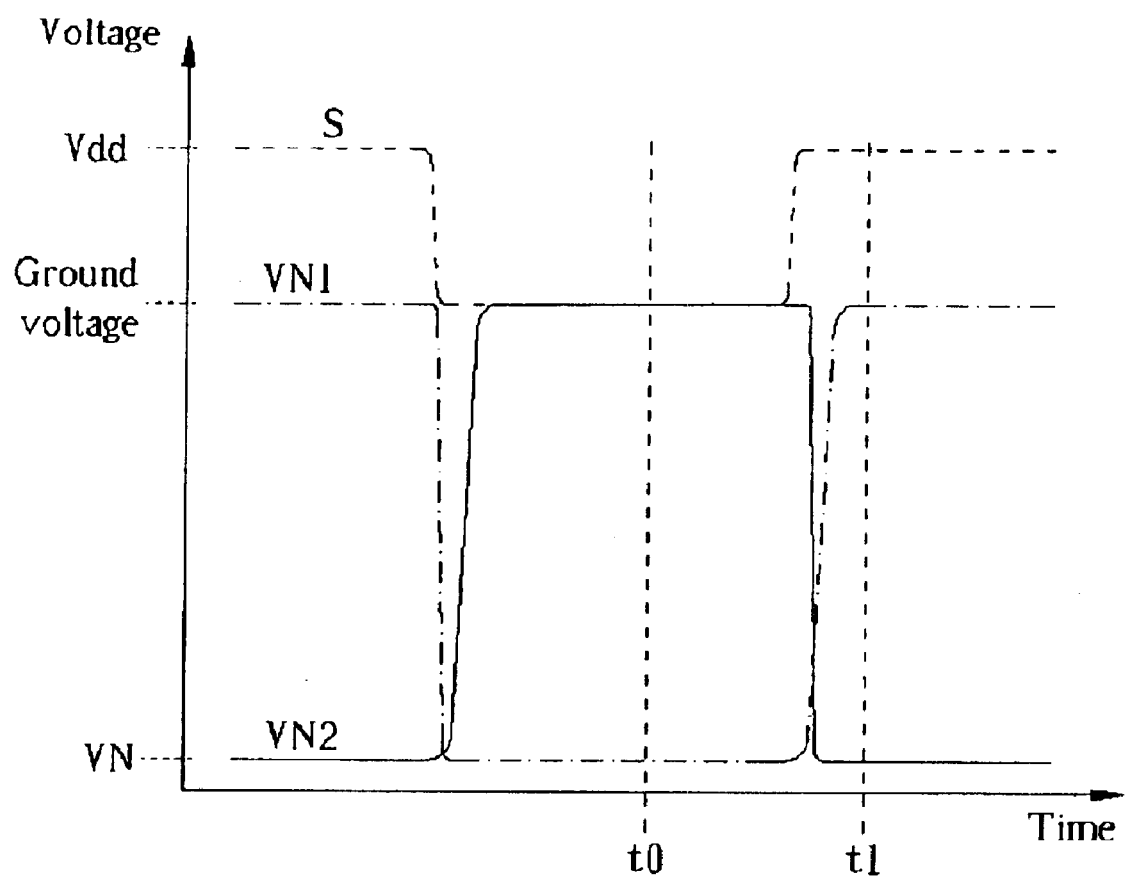
FIG. 5 is a timing diagram of various related voltages versus time.

Please refer to FIG. 5 (with reference to FIG. 4). FIG. 5 is a timing diagram of voltages VN1, VN2 with respect to the voltage S versus time. As shown in FIG. 5, at time t0, the voltage S equals to the ground voltage, as the voltages VN1, VN2 are respectively the negative voltage VN and the ground voltage. When the voltage S at time t1 is switched to the positive voltage Vdd, the voltages VN1, VN2 are switched to the ground voltage and the negative voltage VN. Within the switch 10, the transistors QN3, QN4 of the driving units 32,34 directly receive the input voltages from the inverters INV1, INV2. Such accelerates response speed with respect to the voltage VN1, VN2 from the negative voltage rising to the ground voltage. The transistors QN1, QN2 of the driving unit 32, 34, ignoring the transistors QN3, QN4, can be directly used to transfer the negative voltage VN to the nodes N1, N2 for simplified circuit.

From the above discussion, the present invention is able to offset the voltage level by using inverting units QP1, QP2 and driving units 32, 34. The range of the voltage S inputting at the control end CTL of the inverter 10 is between the positive voltage Vdd and the ground voltage. By way of the inverting units and the driving units, the range of the output voltage at node N1, N2 becomes between the positive voltage Vdd and the negative voltage VN, where the positive voltage Vdd is outputted while the inverting units (transistor QP1, QP2) are turning on, and the negative voltage VN is outputted while each transistor of the driving unit 32, 34 is turning on. In this case, a specific triple-well n-type MOS transistor is used to transfer the negative voltage VN in the driving units 32,34.

The transistors QN5–QN8, especially the transistors QN7, QN8 whose sources are biased by the negative voltage VN for transferring the negative voltage VN, can transfer the desiring voltage to each voltage output end after the desiring voltage is offset by the inverting units and the driving units. Take the transistor QN7 for example. In order to output the ground voltage at the voltage output end Op2, the transistor QN7 has to be turned off, which the turn-on transistor QN5 is capable of transferring the ground voltage to the voltage output end Op2. Nevertheless, the ground voltage with 0 volt is not enough to control the gate of the transistor QN7, due to less gate-source voltage difference, resulting in the transistor QN7 failing to be turned off completely. But after voltage offset, the transistor QN7 can be turned off because of the negative voltage VN at the node N1.

Figure 6:
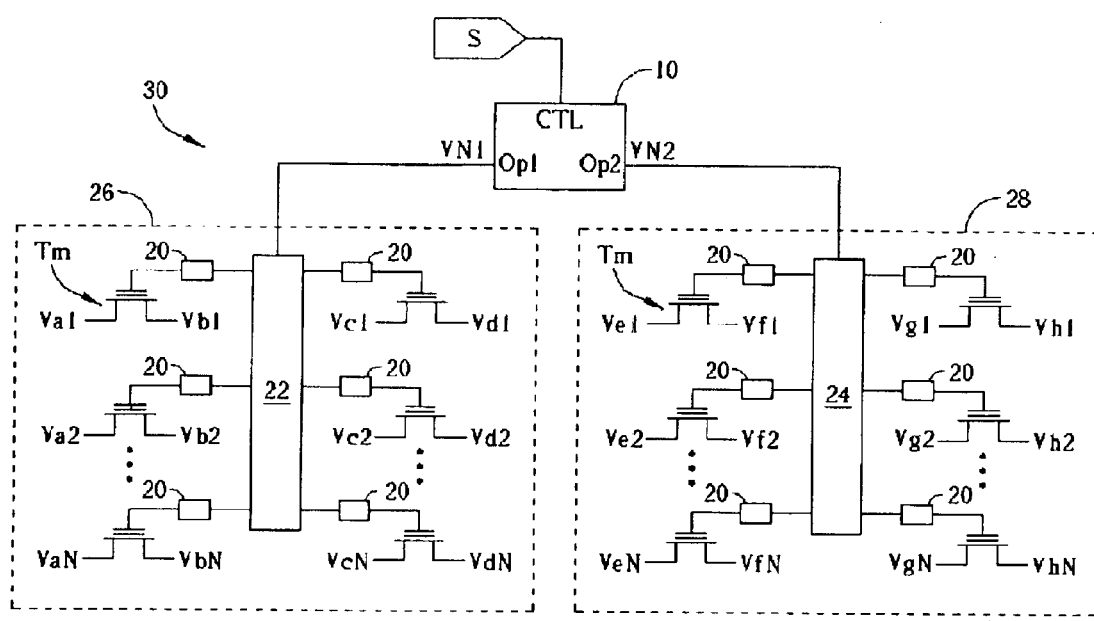
FIG. 6 is a schematic diagram of the switch employed in a memory according to the present invention.

Please refer to FIG. 6. FIG. 6 is schematic diagram of the switch 10 employed in a memory 30 according to the present invention. The memory 30 has two memory arrays 26, 28 each having a plurality of memory transistor Tm, and being selectively accessed by a decoder 22,24, respectively. Each control gate of memory transistors of the two memory arrays 26,28 used in the switch 10 is capable of respectively being controlled by the output voltage at the voltage output end Op1, Op2. For instance, while the voltage S at the control end CTL is the ground voltage with 0 Volt, the negative voltage VN for voltage output end Op1 is capable of being transferred to each control gate of memory transistor Tm of the memory array 26 by way of the decoder 22 and auxiliary circuits 20 (like bias circuits). Because of the bias with the negative voltage VN (in conjunction with voltages Va1-VaN, Vb1-VbN, Vc1-VcN, and Vd1-VdN), each memory transistor of the memory array 26 is capable of performing data-erasing. Meanwhile, the ground voltage for voltage output end Op2 is capable of being transferred to each control gate of memory transistor Tm of the memory array 28 by way of the decoder 24 and auxiliary circuits 20. Because of the bias with the ground voltage (in conjunction with voltages Ve1-VeN, Vf1-VfN, Vg1-VgN, and Vh1-VhN), each memory transistor of the memory array 28 is capable of performing data-reading or other operations. While voltage S is changing from the ground voltage to the positive voltage Vdd, the output voltage at the voltage output end Op1, Op2 is switched, such that the memory transistors of the memory array 26 using the ground voltage with 0 volts is capable of performing data-reading, and the memory transistors of the memory array 28 using the negative voltage VN is capable of performing data-erasing. In other words, through the output voltage at the two voltage output ends of the switch 10, the flash memory 30 can simultaneously erase data and read data. In addition, the different memory arrays can be switched to different memory operations by switching output voltages at different voltage output ends within the switch 10 by means of controlling the voltage S.

To sum up, the switch 10 of the present invention utilizes two p-type MOS transistors QP1,QP2 and four triple-well n-type MOS transistors QN1–QN4 for offsetting and expanding the voltage range from the interval between the positive voltage Vdd and the ground voltage to that between the positive voltage Vdd and the negative voltage VN. In this way, the transistors QN5–QN8 are capable of correctly transferring the ground voltage or the negative voltage to the two voltage output ends Op1, Op2 of the switch 10. The present invention can be widely used in flash memory so as to provide different bias voltages, especially the negative voltage VN, to each memory transistor for dealing with different requirements under different operations.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A switch having a control end and a voltage output end comprising:
   a first inverting unit and a second inverting unit, each having an input end and an output end; wherein when the input end of said inverting unit receives a ground voltage, a positive voltage differing from the ground voltage is outputted from the output end of the inverting unit;
   a first driving unit and a second driving unit, each having an input end and an output end; wherein both the input ends of the first driving unit and the second driving unit are electrically connected to the output ends of the second inverting unit and the first inverting unit at a second node and a first node, respectively; the output ends of the first driving unit and the second driving unit are electrically connected to the first node and the second node; and when the positive voltage is inputted to the input end of a driving unit, a negative voltage differing from the ground voltage and the positive voltage is outputted from the output end of the driving unit;
   a negative voltage transferring unit electrically connected between the second node and the voltage output end; wherein when the positive voltage is inputted to the negative voltage transferring unit at the second node, the negative voltage transferring unit is turned on, and transmits the negative voltage to the voltage output end; and when the negative voltage is inputted to the negative voltage transferring unit at the second node, the negative voltage transferring unit is turned off, and stops transmitting the negative voltage to the voltage output end;
   a ground voltage transferring unit electrically connected between the first node and the voltage output end, wherein when the positive voltage is inputted at the first node, the ground voltage transferring unit outputs the ground voltage at the voltage output end, such that the when the input end of the first inverting unit inputs the ground voltage, leading to the negative voltage transferring unit turning off, the ground voltage transferring unit outputs the ground voltage at the voltage output end; and
   an inverter electrically connected between the input ends of the first inverting unit and the second inverting unit for ensuring a polarity phase of the voltage at the input end of the first inverting unit is opposite to the voltage at the input end of the second inverting unit;
   wherein the switch causes the input end of the first inverting unit to accept the positive voltage or the negative voltage based on the received signal with respect to the control end; when the positive voltage is inputted into the input end of the first inverting unit, the inverter makes the input end of the second inverting unit accept the ground voltage, and outputs the positive voltage at the second node, such that the negative voltage transferring unit turns on, and outputs the negative voltage at the voltage output end; when the ground voltage is inputted into the input end of the first inverting unit, the first inverting unit outputs the positive voltage at the first node, resulting in the second driving unit outputting the negative voltage at the second node, and the negative voltage transferring unit turning off, and thus stopping outputting the negative voltage at the voltage output and.

2. The switch of claim 1 wherein the positive voltage is higher than the ground voltage, and the negative voltage is lower than the ground voltage.

3. The switch of claim 1 wherein each driving unit comprises:
   a first transistor having a source, a drain and a gate, the gate of the first transistor being electrically connected to the input end of the driving unit, the source of first transistor being biased by the negative voltage, and the drain being electrically connected to an output end of the inverting unit.

4. The switch of claim 3, wherein each driving unit further comprises a second transistor having a source electrically connected to the drain of the first transistor, a drain electrically connected to the output and of an inverting unit, and a gate electrically connected to the input end of the inverting unit.

5. The switch of claim 1 wherein each inverting unit comprises a p-type MOS transistor having a gate acting as the input end of the inverting unit, a drain acting as the input end of the inverting unit, and a source biased by the positive voltage.

6. The switch of claim 1 wherein the ground voltage transferring unit comprises a transistor having a source biased by the ground voltage, a gate electrically connected to the voltage output end, and a drain electrically connected to the first node.

7. The switch of claim 6 wherein the transistor is a triple-well n-type MOS transistor.

8. The switch of claim 1 wherein the negative voltage transferring unit comprises a transistor having a source biased by the negative voltage, a gate electrically connected to the second node, and a drain electrically connected to the voltage output end.

9. The switch of claim 8 wherein the transistor is a triple-well n-type MOS transistor.

10. The switch of claim 1 for use in a flash memory, wherein the flash memory comprises at least a memory transistor for recording a bit of digital data, the memory transistor having an electrode electrically connected to the voltage output end of the switch and being capable of changing the recorded data or reading the recorded data based on the voltage applied on the memory transistor.

11. A flash memory comprising:
    at least a memory transistor for recording a bit of digital data; the memory transistor having an electrode electrically connected to the voltage output end of the switch, and being capable of changing the recorded data or reading the recorded data based on the voltage applied on the memory transistor; and a switch having a control end and a voltage output end comprising:
- a first inverting unit and a second inverting unit, each having an input end and an output end; wherein when the input end of an inverting unit receives a ground voltage, a positive voltage differing from the ground voltage is outputted from the output end of the inverting unit;
- a first driving unit and a second driving unit, each having an input end and an output end; wherein both the input end of the first driving unit and the second driving unit are electrically connected to the output ends of the second inverting unit and the first inverting unit at a second node and a first node, respectively; the output ends of the first driving unit and the second driving unit are electrically connected to the first node and the second node; and when the positive voltage is inputted to the input end of a driving unit, a negative voltage differing from the ground voltage and the positive voltage is outputted from the output end of the driving unit;
- a negative voltage transferring unit electrically connected between the second node and the voltage output end; wherein when the positive voltage is inputted to the negative voltage transferring unit at the second node, the negative voltage transferring unit is turned on, and transmits the negative voltage to the voltage output end; and when the negative voltage is inputted to the negative voltage transferring unit at the second node, the negative voltage transferring unit is turned off, and stops transmitting the negative voltage to the voltage output end;
- a ground voltage transferring unit electrically connected between the first node and the voltage output end; wherein when the positive voltage is inputted at the first node, the ground voltage transferring unit outputs the ground voltage at the voltage output end, such that the when the input end of the first inverting unit is inputted the ground voltage, leading to the negative voltage transferring unit turn off, the ground voltage transferring unit outputs the ground voltage at the voltage output end; and
- an inverter electrically connected between the input ends of the first inverting unit and the second inverting unit for ensuring a polarity phase of the voltage at the input end of the first inverting unit reverses from that of the voltage at the input end of the second inverting unit;

wherein the switch determines the input end of the first inverting unit to accept the positive voltage or the negative voltage based on the received signal with respect to the control end; when, the positive voltage is inputted into the input end of the first inverting unit, the inverter makes the input end of the second inverting unit accept the ground voltage, and outputs the positive voltage at the second node, such that the negative voltage transferring unit turns on, and outputs the negative voltage, at the voltage output end; and when the ground voltage is inputted into the input end of the first inverting unit, the first inverting unit outputs the positive voltage at the first node, resulting in the second driving unit outputting the negative voltage at the second node, and the negative voltage transferring unit turning off, and thus stopping outputting the negative voltage at the voltage output end.

12. The flash memory of claim 11 wherein the positive voltage is higher then the ground voltage, and the negative voltage is lower than the ground voltage.

13. The flash memory of claim 11 wherein the ground voltage transferring unit comprises a transistor having a source biased by the ground voltage, a gate electrically connected to the first node, and a drain electrically connected to the voltage output end.

14. The flash memory of claim 13 wherein the transistor is a triple-well n-type MOS transistor.

15. The flash memory of claim 11 wherein each driving unit comprises:
- a first transistor having a source, a drain and a gate, the gate of the first transistor being electrically connected to the input end of the driving unit, the source of first transistor being biased by the negative voltage, and the drain being electrically connected to an output end of the inverting unit.

16. The flash memory of claim 15 wherein the switch is formed on a p-type substrate, and the first transistor is a triple-well n-type MOS transistor, the first transistor comprising:
- an n-well formed on the p-type substrate; and
- a p-well formed on the n-well, both the source and the drain of transistor being set on the p-well;
- wherein the n-well is biased with the positive voltage, the p-well is biased with the negative voltage, and the p-type substrate is biased with the ground voltage.

17. The flash memory of claim 15 wherein each driving unit further comprises a second transistor having a source electrically connected to the drain of the first transistor, a drain electrically connected to the output end of an inverting unit, and a gate electrically connected to the input end of the inverting unit.

18. The flash memory of claim 17 wherein the second transistor is a triple-well n-type MOS transistor.

19. The flash memory of claim 11 wherein each inverting unit comprises a p-type MOS transistor having a gate acting as the input end of the inverting unit, a drain acting as the input end of the inverting unit, and a source biased by the positive voltage.

20. The flash memory of claim 11 wherein the negative voltage transferring unit comprises a transistor having a source biased by the negative voltage, a gate electrically connected to the second node, and a drain electrically connected to the voltage output end.

21. The flash memory of claim 20 wherein the transistor of the negative voltage transferring unit is a triple-well n-type MOS transistor.

* * * * *